United States Patent
Cheng et al.

(10) Patent No.: US 10,541,172 B2
(45) Date of Patent: Jan. 21, 2020

(54) SEMICONDUCTOR DEVICE WITH REDUCED CONTACT RESISTANCE

(71) Applicant: International Business Machines Corporation, Armonk, NY (US)

(72) Inventors: Kangguo Cheng, Schenectady, NY (US); Sean Teehan, Rensselaer, NY (US); Alex J. Varghese, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/245,756

(22) Filed: Aug. 24, 2016

(65) Prior Publication Data

US 2018/0061762 A1    Mar. 1, 2018

(51) Int. Cl.
| | |
|---|---|
| *H01L 21/768* | (2006.01) |
| *H01L 23/532* | (2006.01) |
| *H01L 23/31* | (2006.01) |
| *H01L 23/535* | (2006.01) |

(52) U.S. Cl.
CPC .. *H01L 21/76814* (2013.01); *H01L 21/76897* (2013.01); *H01L 23/3171* (2013.01); *H01L 23/535* (2013.01); *H01L 23/5329* (2013.01)

(58) Field of Classification Search
CPC ............. H01L 23/535; H01L 21/76895; H01L 21/76849; H01L 21/823475; H01L 21/768
See application file for complete search history.

(56) References Cited

U.S. PATENT DOCUMENTS

| | | | | |
|---|---|---|---|---|
| 5,166,093 | A | * | 11/1992 | Grief .................... H01L 21/3212 148/DIG. 138 |
| 5,394,012 | A | * | 2/1995 | Kimura ............. H01L 21/28512 257/739 |
| 5,893,751 | A | * | 4/1999 | Jenq .................. H01L 21/28518 257/E21.165 |
| 6,375,790 | B1 | | 4/2002 | Fenner |
| 6,797,339 | B2 | | 9/2004 | Akizuki et al. |
| 6,812,147 | B2 | | 11/2004 | Skinner et al. |
| 7,115,511 | B2 | | 10/2006 | Hautala |
| 7,968,422 | B2 | | 6/2011 | Hautala |
| 8,313,663 | B2 | | 11/2012 | Hautala |
| 8,877,299 | B2 | | 11/2014 | Hautala et al. |
| 2002/0061645 | A1 | * | 5/2002 | Trivedi ............. H01L 21/76877 438/640 |

(Continued)

OTHER PUBLICATIONS

Allen et al., "Craters on silicon surfaces created by gas cluster ion impacts", J. App. Phys., 92(7) pp. 3671-3678 (2002).

(Continued)

*Primary Examiner* — Ahmed N Sefer
(74) *Attorney, Agent, or Firm* — Cantor Colburn LLP; Vazken Alexanian

(57) ABSTRACT

An interconnect structure and methods of forming the interconnect structure an interconnect dielectric including at least one contact landing within the interconnect dielectric and/or underlying the interconnect dielectric. The structure and methods include roughening an exposed surface of at least one contact landing to increase the surface area of a conductive metal subsequently disposed in a contact feature and in direct contact with the roughened surface of the least one contact landing.

7 Claims, 4 Drawing Sheets

(56) References Cited

U.S. PATENT DOCUMENTS

| | | | | |
|---|---|---|---|---|
| 2006/0163559 | A1* | 7/2006 | Koganei | H01L 51/0021 257/40 |
| 2006/0275992 | A1* | 12/2006 | Mansoori | H01L 21/823814 438/300 |
| 2007/0048955 | A1* | 3/2007 | Yates | H01L 27/1085 438/309 |
| 2007/0178695 | A1* | 8/2007 | Sun | H01L 21/76849 438/672 |
| 2007/0232075 | A1* | 10/2007 | Imada | H01L 21/3105 438/758 |
| 2008/0135901 | A1* | 6/2008 | Shimojo | H01L 21/76816 257/295 |
| 2009/0317564 | A1 | 12/2009 | Hautala et al. | |
| 2012/0139032 | A1* | 6/2012 | Akahori | H01L 21/28273 257/326 |
| 2013/0270715 | A1* | 10/2013 | Malatkar | H01L 23/481 257/774 |
| 2016/0049515 | A1* | 2/2016 | Basker | H01L 29/66795 257/192 |
| 2016/0343821 | A1* | 11/2016 | Chiou | H01L 29/458 |
| 2016/0372370 | A1* | 12/2016 | Yamada | H01L 21/0485 |

OTHER PUBLICATIONS

Allen et al., "Nanoscale surface texturing by impact of accelerated condensed-gas nanoparticles" Proc.Intl. Symp. on Optical Science and Technology, pp. 225-232 International Society for Optics and Photonics (2002).

Allen et al., "Substrate smoothing using gas cluster ion beam processing", Journal of electronic materials, 30(7), pp. 829-833 (2001).

Fenner et al., "Fractal topography of surfaces exposed to gas-cluster ion beams and modeling simulations", J. Appl. Phys., 95(10), pp. 5408-5418 (2004).

Tokioka et al., "Low-damage surface smoothing of laser crystallized polycrystalline silicon using gas cluster ion beam", Nuclear Instruments and Methods in Physics Research Section B: 257(1), 658-661 (2007).

Yamada et al., "Nano-processing with gas cluster ion beams", Nuclear Instruments and Methods in Physics Research Section B: 164 pp. 944-959 (2000).

* cited by examiner

SEMICONDUCTOR DEVICE WITH REDUCED CONTACT RESISTANCE

BACKGROUND

The present invention relates generally to methods and structures for forming semiconductor devices with reduced contact resistance.

An integrated circuit (IC) generally includes a semiconductor substrate in which a number of device regions are formed by diffusion or ion implantation of suitable dopants. This substrate usually includes a passivating layer and an insulating layer, which are required in order to form different device regions. The total thickness of these layers is usually less than one micron. Openings through these layers (called vias or contact holes) and trenches therein allow electrical contact to be made selectively to the underlying device regions. A conducting material such as copper is used to fill these holes, which then make contact to semiconductor devices

SUMMARY

Described herein are interconnect structures and methods of fabricating the interconnect structures. In one or more embodiments, the interconnect structure includes an interconnect dielectric having at least one contact landing within the interconnect dielectric and/or underlying the interconnect dielectric. The at least one contact landing includes a roughened upper surface, and a conductive metal in contact with the roughened upper surface of the contact landing, wherein the roughened upper surface has a surface roughness of 1 nanometer to 10 nanometer.

In one or embodiments, a method of fabricating an interconnect structure includes forming one or more openings in an interconnect dielectric, wherein the one or more openings expose at least one contact landing. An oxidative gas cluster ion beam process is then performed to the at least one contact landing, wherein oxidative gas cluster ion beam process forms an irregular oxide layer on an exposed surface of the at least one contact landing. Next, a cleaning process is performed o selectively remove the irregular oxide layer from the exposed surface of the at least one contact landing to form an irregular surface on the at least one contact landing, wherein the irregular surface has a surface roughness of 1 nanometer to 10 nanometers. The one or more openings are then filled with a conductive metal, wherein the conductive metal directly contacts the irregular surface on the at least one contact landing.

In one or more other embodiments, a method of fabricating an interconnect structure includes forming one or more openings in an interconnect dielectric, wherein the one or more openings expose at least one contact landing, and wherein the at least one contact landing has a smooth planar exposed surface. The smooth planar exposed surface of the at least one contact landing is roughened to form a roughened surface, wherein the roughened surface has a surface roughness of 1 nanometer to 10 nanometers. The one or more openings exposing the at least one contact landing are then filled with a conductive metal, wherein the conductive metal directly contacts the roughened surface on the at least one contact landing.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings. FIGS. 1-6 are a series of views illustrating a process flow of forming an interconnect structure according to non-limiting embodiments of the invention, in which:

FIG. 1 illustrates a cross sectional view of an interconnect dielectric layer;

FIG. 2 illustrates an exemplary interconnect structure following deposition of the interconnect dielectric onto a substrate in accordance with one or more embodiments;

FIG. 3 illustrates the interconnect structure shown in FIG. 2 following a lithographic and etching process to form one or more openings in the interconnect dielectric and expose a surface at least one contact landing;

FIG. 4 illustrates the interconnect structure shown in FIG. 3 following gas cluster ion beam oxidation to form an oxide layer in the exposed surface of the at least one contact landing in the interconnect dielectric;

FIG. 5 illustrates the interconnect structure shown in FIG. 4 after removing the oxide layer from the exposed surface of the least one contact landing and depositing a conductive material in the one or more openings and in direct contact with the at least one contact landing; and FIG. 6 illustrates a photomicrograph of a cross sectional view of a contact landing after oxidative gas cluster ion beam processing.

DETAILED DESCRIPTION

Within a typical damascene interconnect structure, for example, metal vias run perpendicular to the semiconductor substrate (e.g., the substrate thickness) and metal lines run parallel to the semiconductor substrate (e.g., the substrate length). Typically, the metal vias are present beneath the metal lines and both features are embedded within a dielectric material. As the dimensions of integrated circuit shrink in the quest to improve chip performance, the reduction of contact area results in an increase in contact resistance. Moreover, it is generally desirable to reduce contact resistance to improve device performance.

Described herein are methods and structures for forming semiconductor devices with reduced contact resistance utilizing a gas cluster ion beam technique and cleaning process to increase surface area of a contact landing as well as contact structures that are formed from the same, which will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the present invention can be practiced without these specific details. In other instances, well-known structures or processing steps have not been described in detail in order to avoid obscuring the present invention.

It will be understood that when an element as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Figure 1:

Reference is first made to FIG. 1, which illustrates an interconnect dielectric material 10 that can be employed in one or more embodiments of the present invention. The interconnect dielectric material 10 shown in FIG. 1 is typically formed on a surface of a substrate (not shown). The substrate can include a semiconducting material, an insulating material, a conductive material or any combination thereof. When the substrate is a semiconducting material, any semiconductor such as Si, SiGe, SiGeC, SiC, Ge alloys, GaAs, InAs, InP and other III/V or II/VI compound semiconductors can be used. In addition to these listed types of semiconducting materials, embodiments of the present invention also contemplate cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate can include, for example, polysilicon, an elemental metal, alloys of elemental metals, a metal silicide, a metal nitride or combinations thereof including multilayers. When the substrate is a semiconducting material, one or more semiconductor devices such as, for example, complementary metal oxide semiconductor (CMOS) devices can be fabricated thereon.

The interconnect dielectric material 10 can include any middle-of-the-line (MOL) or back-end-of-the-line (BEOL) dielectric including inorganic dielectrics or organic dielectrics. The interconnect dielectric material 10 can be porous or non-porous. Porous dielectric materials generally have a lower dielectric constant than the non-porous counterparts. Some examples of suitable dielectrics that can be used as the interconnect dielectric material 10 include, but are not limited to, $SiO_2$, silsesquixoanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one or more embodiments, the interconnect dielectric material 10 has a dielectric constant that is about 4.0 or less. In one or more other embodiments, the interconnect dielectric material 10 has a dielectric constant of about 2.8 or less. All dielectric constants mentioned in this detailed description are relative to a vacuum unless otherwise noted. Dielectrics having a dielectric constant of about 4.0 or less generally have a lower parasitic crosstalk as compared with dielectric materials that have a higher dielectric constant than 4.0. The thickness of the interconnect dielectric material 10 can vary depending upon the device dimensions, and the dielectric material used as well as the exact number of dielectrics within the interconnect dielectric material 10.

Figure 2:
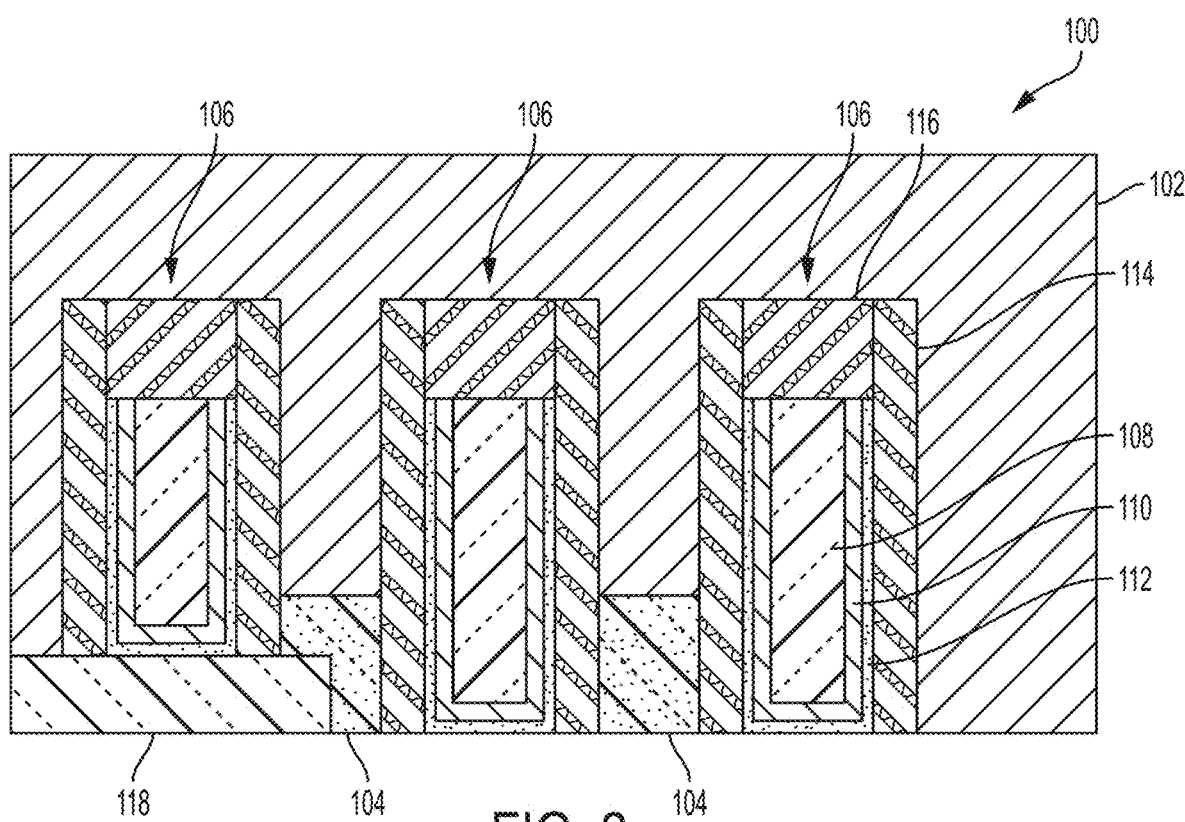

Referring now to FIG. 2, there is shown an exemplary semiconductor device 100 after deposition of an interconnect dielectric layer 102 onto the substrate. The semiconductor device can include, inter alia, at least one contact landing 104 within and/or underlying the interconnect dielectric 102, which is formed of a conductive material. In the exemplary structure, the contact landing 104 is a source and/or drain region of a device. Additionally, the semiconductor device 100 can include other devices and structures. By way of example, the semiconductor device can include one or more gate structures 106, e.g., a replacement metal gate structure, which can include a conductor 108 such as tungsten, a liner 110 such as TiN disposed about the conductor 108, a high k dielectric gate 112 on the liner 110, sacrificial spacers 114 such as SiBCN or SiNO, and a sacrificial capping layer 116. The gate structures 106 can be adjacent to a channel region defined by a silicon fin channel 118. Although reference has been made to a replacement metal gate structure, it should be readily apparent that the interconnect dielectric can include other structures and/or devices utilized in semiconductor devices including one or more interconnect structures.

Figure 3:
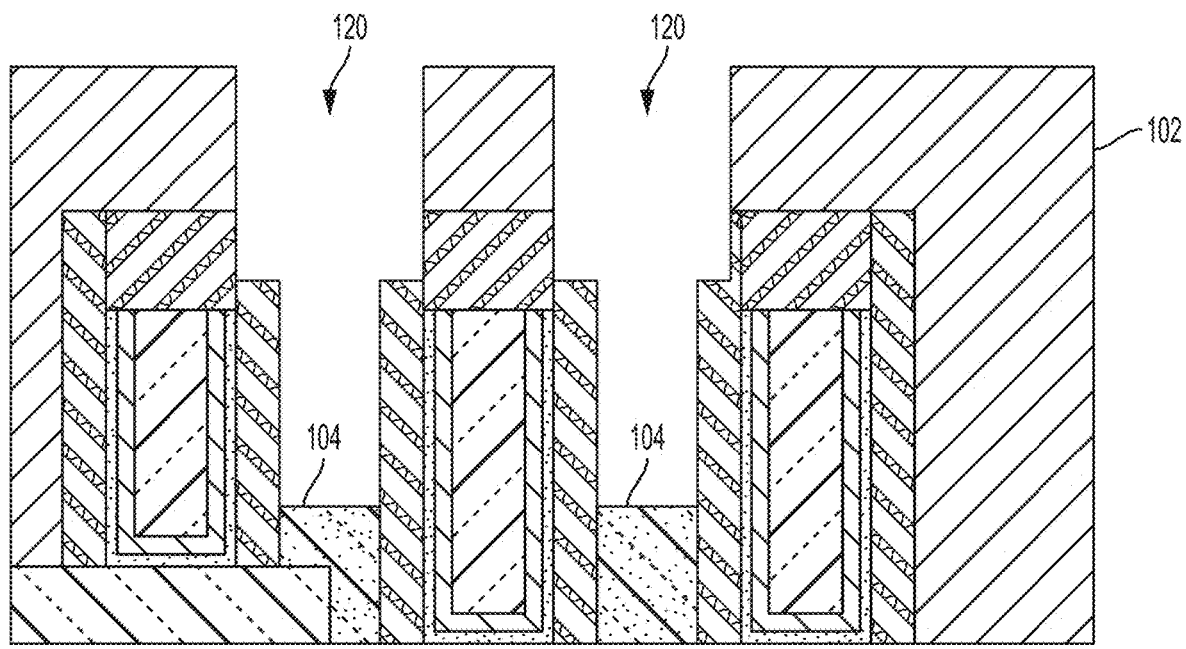

Referring to FIG. 3, there is illustrated the semiconductor device 100 of FIG. 2 after forming a plurality of openings 120 to the contact landing 104 of the source and/or drain region. The plurality of openings 120 that are formed can include a via opening, or a combination of a via and trench opening. In the illustrated semiconductor device, the via 120 extends to the contact landing 104 formed within the interconnect dielectric 102. In one or more other embodiments, the via(s) extends through the entirety of the interconnect dielectric 102 to electrically connect different metal layers during back end of line processing.

Each opening of the plurality of openings 120 can be formed utilizing techniques well known to those skilled in the art. For example, each opening of the plurality of openings can be formed by lithography (i.e., applying a photoresist to the surface of the interconnect dielectric material 102, exposing the photoresist to a desired pattern of radiation, and developing the exposed resist utilizing a conventional resist developer), and etching (dry etching or wet etching) an opening in the interconnect dielectric material 102. The term "dry etching" is used herein to denote an etching technique such as reactive-ion etching, ion beam etching, plasma etching or laser ablation.

When a combined via and line opening is formed, a second iteration of lithography and etching is typically employed. Also, in one or more embodiments, the via can be formed first, followed by the trench such as by a dual damascene process. In one or more other embodiments, the line can be formed first, then the via. In either instance, the via and line are in communication with each other.

Each via opening 120 is an opening that runs perpendicular to the underlying substrate and it generally has a width, w, as measured from one sidewall to another sidewall, of from 10 nm to less than 80 nm. Each line opening which runs parallel to the underlying substrate has a width, $w_1$, which is greater than the width of each via opening 120. Typically, each line opening has a width, $w_1$, measured from one sidewall to another sidewall, of from 15 nm to 80 nm. Each via opening 120 that is formed can have a same or different width and/or height. Each line opening that is formed can have a same or different width and/or height.

Figure 4:
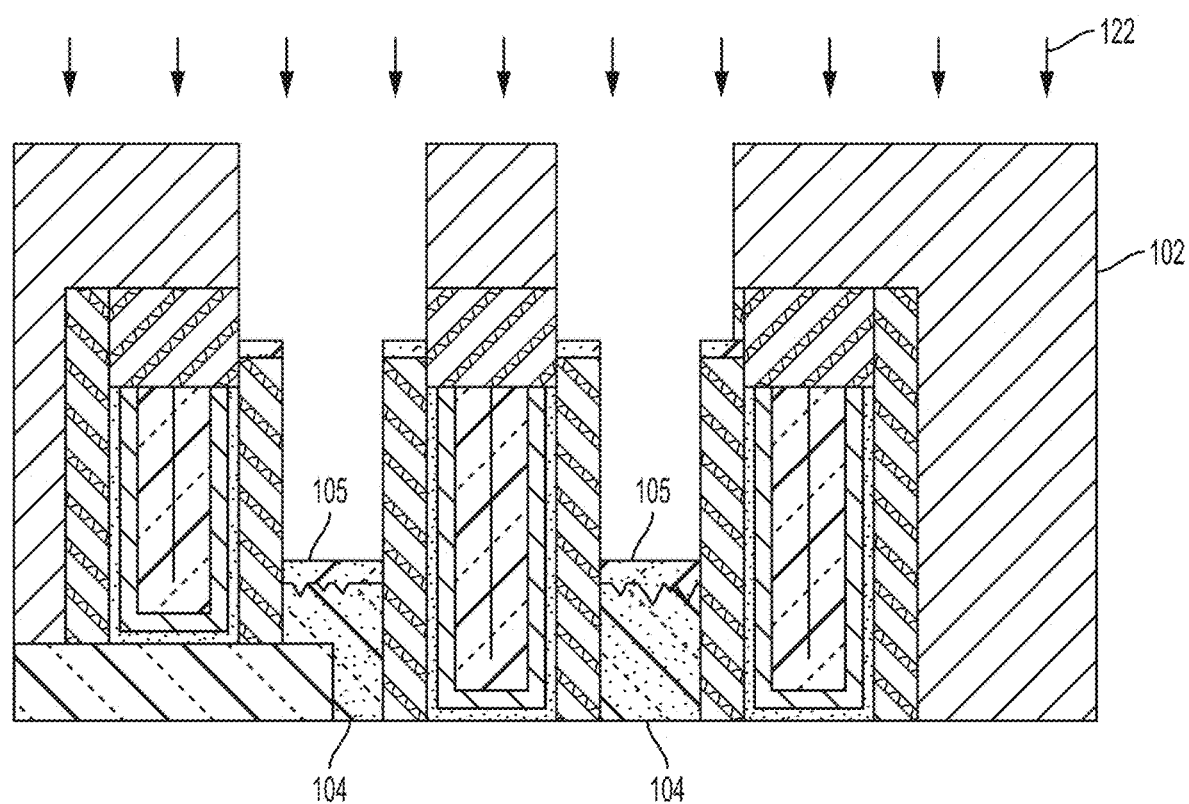

Referring to FIG. 4 there is illustrated the structure of FIG. 2 during and after performing an gas cluster ion beam anisotropic oxidation process in which the exposed surface of the contact landing 104 is oxidized to form an oxide layer 105 therein, among other surfaces such as the spacer layer 114. Reference numeral 122 denotes a beam of gas cluster ions that are generated during the gas cluster ion beam oxidation process, which is perpendicular to the longitudinal axis of the interlayer dielectric, i.e., perpendicular to the contact landing surface. The penetration of oxidation within the exposed surface of the contact landing 104 is irregular and variable across a length of the exposed contact landing as shown.

In the gas cluster ion beam process used to provide the oxidized surface, beams composed of clusters of oxygen atoms can be singly ionized, accelerated, and impact the surfaces of the semiconductor device 100. The gas cluster ion beam process can be performed in a vacuum environment of any conventional ion-beam apparatus. As such, contamination control for the work piece surface can be obtained. The interconnect dielectric 102, which is itself oftentimes an oxygen containing dielectric such as silicon dioxide, will not suffer plasma damage. Likewise, damage to the other materials such as the spacer layers 114 will be minimal at worse and at any rate, of no consequence.

In one or more embodiments, the gas cluster ion beam oxidation process can be performed with a dose from $1 \times e^{12}$ clusters/cm$^2$ to $1 \times e^{18}$ clusters/cm$^2$. In another embodiment, the gas cluster ion beam oxidation can be performed with a dose from $1 \times e^{14}$ clusters/cm$^2$ to $1 \times e^{18}$ clusters/cm$^2$. Other doses that are below and/or above the aforementioned ranges can also be employed in embodiments of the present invention.

In one or more embodiments, the gas cluster ion beam oxidation can be performed at a pressure from $10^{-2}$ Torr to $10^{-6}$ Torr. In one or more other embodiments, the gas cluster ion beam oxidation can be performed at a pressure from $10^{-3}$ Torr to $10^{-6}$ Torr. Other pressure values that are below and/or above the aforementioned ranges can also be employed in the present invention.

In one or more embodiments, the gas cluster ion beam oxidation that can be performed at a power/energy from 2 keV to 80 keV. In one or more other embodiments, the gas cluster ion beam oxidation that can be employed can be performed at a power/energy from 10 keV to 60 keV. Other power/energy values that are below and/or above the aforementioned ranges can also be employed in embodiments of the present invention.

In one or more embodiments, the gas cluster ion beam oxidation can be performed at a temperature from 20° C. to 500° C. In one or more other embodiments, the gas cluster ion beam oxidation can be performed at a temperature from 20° C. to 400° C. Other temperatures that are below and/or above the aforementioned ranges can also be employed in embodiments of the present invention.

In one or more embodiments, the gas used in the gas cluster ion beam oxidation process is composed of an oxidative reactive gas, including, but not limited to, oxygen and/or an oxygen-containing gas and any combination thereof. The oxidative reactive gas can be used neat (i.e., 100% pure reactive gas), or the oxidative reactive gas can be admixed with a quantity of an inert gas such as, for example, neon (Ne), helium (He), argon (Ar), krypton (Kr) and/or xenon (Xe).

Figure 5:
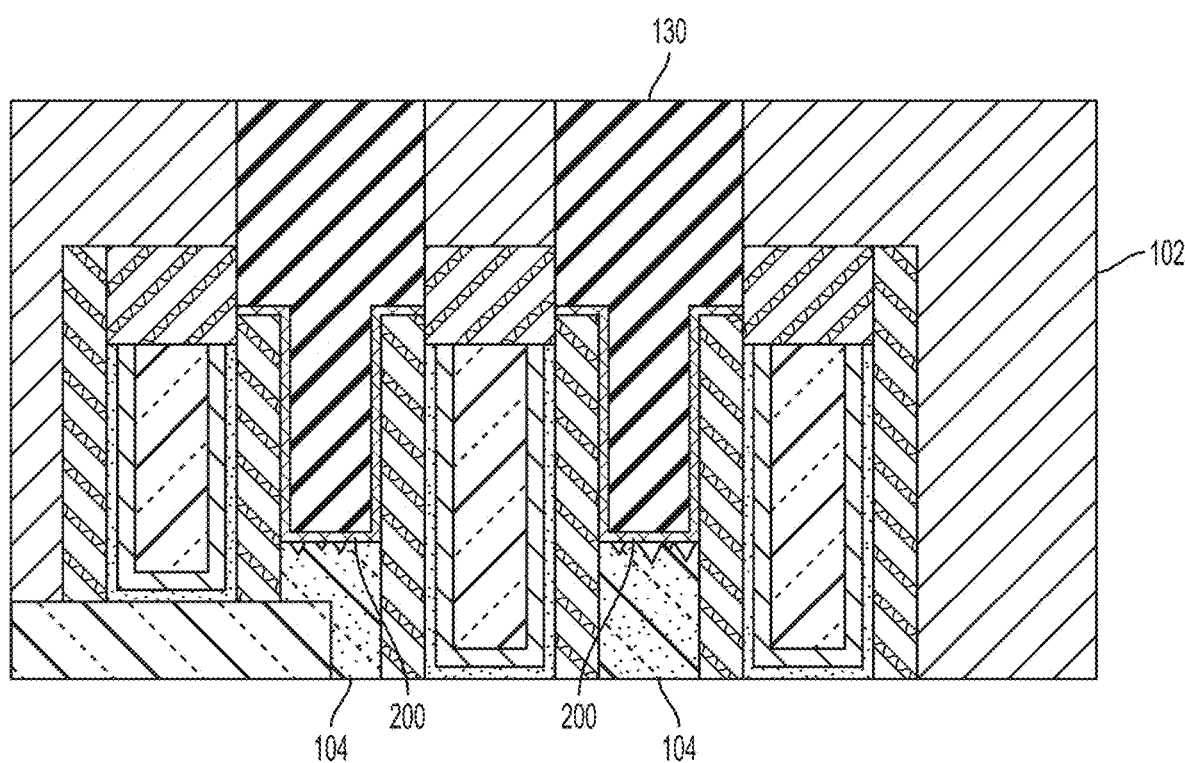

Turning now to FIG. 5, after gas cluster ion beam oxidation of the contact landing 104, the semiconductor device 100 is subjected to a cleaning step so as to remove the oxide formed during the gas cluster ion beam oxidation. Once removed, the surface of the contact landing has a markedly rougher surface, i.e., irregular non-planar surface, than prior to the gas cluster ion beam oxidation and cleaning step. A conductive material 130 is deposited into the openings and directly contacts the roughened surface of contact landing.

Suitable conductive materials include, for example, polysilicon, a conductive metal, an alloy including at least two conductive metals, a conductive metal silicide or combinations thereof. In one or more embodiments, the conductive material 130 is a conductive metal such as Cu, W or Al. In another embodiment, the conductive material 130 includes Cu or a Cu alloy (such as AlCu).

The conductive material 130 can be formed utilizing a conventional deposition process including, but not limited to, CVD, PECVD, sputtering, chemical solution deposition or plating.

By increasing surface roughness of the contact landing, subsequent filling of the via with a conductive material advantageously reduces the contact resistance, wherein the increased surface roughness increases the surface area that contacts the conductive material. The average surface roughness (Ra) is 1 nanometer (nm) to 10 nm. Surface roughness can be measured in a manner generally known by those skilled in the art. By way of example, surface roughness can be measured microscopically, e.g., transmission electron microscopy.

The cleaning process can be a wet etch process to selectively remove the oxide layer from the contact landing. An exemplary wet etch process includes is by etching using water diluted HF with some buffering agents such as ammonium fluoride.

Optionally, a diffusion barrier (200) can be conformally deposited and patterned before or after the gas cluster ion beam oxidation and cleaning steps The diffusion barrier can include Ta, TaN, Ti, TiN, Ru, RuN, W, WN or any other material that can serve as a barrier to prevent conductive material from diffusing there through. In some embodiments, a combination of the above mentioned diffusion barrier materials, i.e., TiN/Ti or TaN/Ta, can be employed as diffusion barrier. The diffusion barrier can be formed a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. The thickness of the diffusion barrier 16 can vary depending on the exact means of the deposition process as well as the material employed. Typically, the diffusion barrier has a thickness from 4 nm to 40 nm, with a thickness from 7 nm to 20 nm being more typical.

In some embodiments, especially when Cu or a Cu alloy is employed as the conductive material 130, an optional plating seed layer (not shown) can be formed on the diffusion barrier prior to forming the conductive material. The optional plating seed layer is employed to selectively promote subsequent electroplating of a pre-selected conductive metal or metal alloy. The optional plating seed layer can include Cu, a Cu alloy, Ir, an Ir alloy, Ru, a Ru alloy (e.g., TaRu alloy) or any other suitable noble metal or noble metal alloy having a low metal-plating over potential. Typically, Cu or a Cu alloy plating seed layer is employed, when a Cu metal is to be subsequently formed within the at least one opening. The thickness of the optional seed layer can vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, and PVD.

Figure 6:
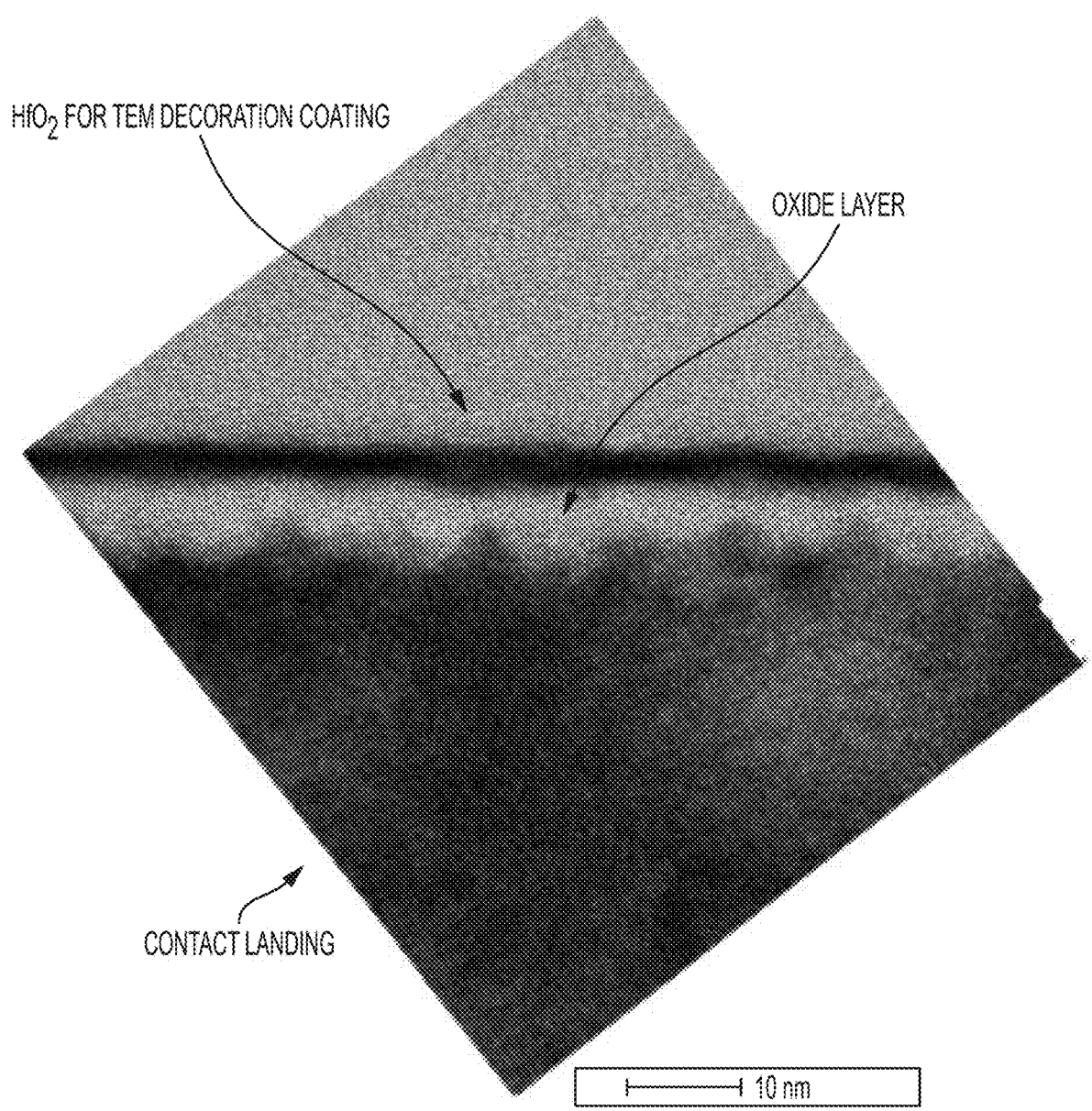

Referring now to FIG. 6, there is shown a transmission electron photomicrograph illustrating surface roughness of a contact landing 104 subsequent to the gas cluster ion beam oxidation. A hafnium oxide decoration coating was provided on the oxidized contact landing.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An intermediate interconnect structure, comprising:
an interconnect dielectric comprising an opening exposing at least one contact landing within the interconnect dielectric and/or an underlying the interconnect dielectric, the at least one contact landing formed of conductive material comprising a roughened upper surface defined by an oxide layer formed therein by a gas cluster ion beam process, wherein the opening is a via having a width of 10 nanometers to 80 nanometers, and wherein the roughened upper surface has a surface roughness of 1 nanometer to 10 nanometers.

2. The intermediate interconnect structure of claim 1, wherein the at least one contact landing comprises a source and/or drain region.

3. The intermediate interconnect structure of claim 1, wherein the at least one contact landing underlies the interconnect dielectric and the conductive metal extends through the interconnect dielectric to contact the at least one contact landing.

4. The intermediate interconnect structure of claim 1, wherein the interconnect dielectric comprises $SiO_2$, silsesquixoanes, carbon doped oxides that include atoms of Si, C, O and H, thermosetting polyarylene ethers, or multilayers thereof.

5. The intermediate interconnect structure of claim 1, wherein the interconnect dielectric has a dielectric constant less than 4.0.

6. The intermediate interconnect structure of claim 1, wherein the conductive metal comprises copper.

7. The intermediate interconnect structure of claim 1, further including a barrier layer intermediate the interconnect dielectric and the conductive metal, wherein the barrier layer is a conductive material.

* * * * *